(12) United States Patent
Li

(10) Patent No.: US 11,854,953 B2
(45) Date of Patent: Dec. 26, 2023

(54) PACKAGING SUBSTRATE, PACKAGING STRUCTURE, ELECTRONIC DEVICE, AND MANUFACTURING METHOD TO REDUCE A PACKAGING SIZE

(71) Applicant: Huawei Technologies Co., Ltd., Guangdong (CN)

(72) Inventor: Zan Li, Dongguan (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 216 days.

(21) Appl. No.: 17/447,993

(22) Filed: Sep. 17, 2021

(65) Prior Publication Data
US 2022/0093497 A1 Mar. 24, 2022

(30) Foreign Application Priority Data
Sep. 22, 2020 (CN) .......................... 202011004103.7

(51) Int. Cl.
| | |
|---|---|
| *H01L 23/498* | (2006.01) |
| *H01L 21/52* | (2006.01) |
| *H01L 23/055* | (2006.01) |
| *H01L 23/367* | (2006.01) |

(52) U.S. Cl.
CPC ........ *H01L 23/49811* (2013.01); *H01L 21/52* (2013.01); *H01L 23/055* (2013.01); *H01L 23/3675* (2013.01); *H01L 23/49805* (2013.01); *H01L 23/49822* (2013.01)

(58) Field of Classification Search
CPC ............... H01L 23/49811; H01L 21/52; H01L 23/3675; H01L 23/49805

USPC .................................................. 257/302, 704
See application file for complete search history.

(56) References Cited

U.S. PATENT DOCUMENTS

| | | | | |
|---|---|---|---|---|
| 5,268,533 A | * | 12/1993 | Kovacs | ................. H01L 23/562 174/546 |
| 5,306,948 A | * | 4/1994 | Yamada | ............... G01R 1/0483 361/767 |
| 2011/0169155 A1 | * | 7/2011 | Ogihara | ................ H01L 23/562 257/687 |
| 2016/0343755 A1 | | 11/2016 | Karashima et al. | |

FOREIGN PATENT DOCUMENTS

| | | |
|---|---|---|
| EP | 0272188 A2 | 6/1988 |
| WO | 2009110286 A1 | 9/2009 |

* cited by examiner

*Primary Examiner* — Quoc D Hoang
(74) *Attorney, Agent, or Firm* — WOMBLE BOND DICKINSON (US) LLP

(57) ABSTRACT

A packaging substrate, a packaging structure, an electronic device and a manufacturing method, and pertain to the field of chip packaging technologies. The packaging substrate includes a body including metal cabling. The body includes a first surface, a second surface and a side surface. The side surface is connected to the first surface and second surface. The first surface includes many first connection structures. The second surface includes second connection structures. The side surface includes third connection structures. A part of the first connection structures are connected to the second connection structures by using the metal cabling. The other part of the first connection structures are connected to the third connection structures by using the metal cabling. When the same total quantity of pins need to be disposed, a part of the pins are transferred to the side surface of the body, with less pins at the second surface.

18 Claims, 7 Drawing Sheets

PACKAGING SUBSTRATE, PACKAGING STRUCTURE, ELECTRONIC DEVICE, AND MANUFACTURING METHOD TO REDUCE A PACKAGING SIZE

CROSS-REFERENCE TO RELATED APPLICATIONS

This application claims priority to Chines Patent Application No. 202011004103.7, filed on Sep. 22, 2020, which is hereby incorporated by reference in its entirety.

TECHNICAL FIELD

This application relates to the field of chip packaging technologies, and in particular, to a packaging substrate, a packaging structure, an electronic device, and a manufacturing method.

BACKGROUND

A packaging substrate is a carrier used to package a die. The packaging substrate includes a first surface and a second surface that are opposite to each other. The first surface includes a plurality of first connection structures. The second surface includes a plurality of pins. The pins at the second surface of the packaging substrate are connected to the plurality of first connection structures at the first surface by using metal cabling located inside the packaging substrate.

When packaging is performed on the die, the die is disposed at the plurality of first connection structures of the packaging substrate. Pins of the die are connected to the plurality of first connection structures through welding. The plurality of pins at the second surface of the packaging substrate are configured to weld the packaging substrate to a printed circuit board (PCB).

With the development of technologies, a quantity of first connection structures at the first surface of the packaging substrate increases; and therefore, a quantity of pins at the second surface of the packaging substrate also increases. In this case, a packaging size gradually increases. This easily causes a problem such as thermal deformation of a chip.

SUMMARY

Embodiments of this application provide a packaging substrate, a packaging structure, an electronic device, and a manufacturing method, to overcome a problem of a large packaging size of a chip in a related technology. The technical solutions are as follows:

According to a first aspect, a packaging substrate is provided. The packaging substrate includes a body. The body includes a first surface, a second surface, and a side surface. The first surface and the second surface are two surfaces of the body that are opposite to each other. The side surface is connected to the first surface and the second surface. In some embodiments, the body may be in a polygonal board shape, or may be in a circular board shape. If the body is in a polygonal board shape, the body may include a plurality of side surfaces. If the body is in a circular board shape, the body includes one side surface.

The first surface includes a plurality of first connection structures. The first connection structures are configured to connect to a die. When a packaging structure is manufactured, the die may be disposed on the first surface of the body, and is connected to the plurality of first connection structures. The second surface includes second connection structures. The second connection structures are configured to serve as pins. The side surface includes third connection structures. The third connection structures are also configured to serve as pins.

There is metal cabling inside the body or at a surface of the body. A part of the plurality of first connection structures are connected to the second connection structures by using the metal cabling, and the other part of the plurality of first connection structures are connected to the third connection structures by using the metal cabling.

Based on the foregoing structure, because the side surface of the body includes the third connection structures, and the third connection structures are also connected to the first connection structures by using the metal cabling, the second connection structures and the third connection structures may both serve as pins. When the same total quantity of pins need to be disposed, a part of pins are transferred to the side surface of the body, to reduce a quantity of pins at the second surface. In this way, when packaging is performed on a die, the packaging substrate with a smaller area may be used, to reduce a packaging size.

In one embodiment, the side surface includes two or more rows of third connection structures, and the rows of third connection structures are distributed with a gap in a thickness direction of the body.

For example, the side surface of the body includes two rows of third connection structures, and the two rows of third connection structures are distributed with a gap in the thickness direction of the body.

In the solution shown in this embodiment of this application, because there are at least two rows of third connection structures at the side surface, the side surface can accommodate a relatively large quantity of third connection structures, so that more pins can be transferred to the side surface of the body. In addition, the third connection structures are disposed in rows, to more neatly dispose a leading wire when the third connection structure is connected to a peripheral circuit.

In one embodiment, a minimum distance between the second surface and the third connection structure located at the side surface is not less than a minimum distance between the first surface and the third connection structure located at the side surface.

If the side surface of the body includes only one row of third connection structures, the minimum distance between the third connection structure and the second surface is a distance between the row of third connection structures and the second surface of the body, and the minimum distance between the third connection structure and the first surface is a distance between the row of third connection structures and the first surface of the body.

If the side surface of the body includes two or more rows of third connection structures, the minimum distance between the third connection structure and the second surface is a distance between the row of third connection structures closest to the second surface and the second surface of the body, and the minimum distance between the third connection structure and the first surface is a distance between the row of third connection structures closest to the first surface and the first surface of the body.

In the solution shown in this embodiment of this application, the minimum distance between the third connection structure at the side surface and the second surface is greater than or equal to the minimum distance between the third connection structure at the side surface and the first surface, to avoid a case in which the third connection structure at the side surface is closer to the second surface. When the packaging substrate is disposed on a printed circuit board, a connection is implemented by using the second connection structure located at the second surface. If the third connection structure located at the side surface is excessively close to the second surface, there is a risk that the third connection structure is short-circuited to the printed circuit board. In addition, this does not facilitate the connection between the peripheral circuit and the third connection structure.

In one embodiment, the side surface of the body includes the third connection structures, and the first surface of the body also includes the third connection structures. The third connection structures located at the first surface are also connected to the first connection structures by using the metal cabling. This part of third connection structures also serves as pins.

In the solution shown in this embodiment of this application, a specific quantity of third connection structures are also disposed at the first surface, so that a part of pins are transferred to the first surface. In this way, when a total quantity of pins is fixed, a quantity of pins distributed at the second surface can be further reduced, to further reduce a packaging size.

In one embodiment, the first surface includes a plurality of third connection structures, and the plurality of third connection structures located at the first surface are distributed around the plurality of first connection structures. When the packaging structure is manufactured, the die is located in a region in which the plurality of first connection structures are distributed. The die generally occupies only a middle region of the first surface of the body with a blank region around.

In the solution shown in this embodiment of this application, the plurality of third connection structures are distributed around the plurality of first connection structures, so that the plurality of third connection structures are distributed in a peripheral region of the first surface, to fully use space of the first surface to dispose the third connection structures.

In one embodiment, the third connection structure is a pad or a connector.

In some examples, the third connection structure is a pad. The pad serves as the third connection structure. When the third connection structure is connected to a peripheral circuit, a metal conducting wire such as a gold wire may be welded to the pad.

In some examples, the third connection structure is a first connector. The connector serves as the third connection structure. The connector may be plugged and unplugged, to facilitate a connection between the packaging substrate and a peripheral line. In cases such as maintenance, it is also convenient to implement a disconnection.

In some examples, the body includes the plurality of third connection structures. A part of the third connection structures may be pads, and the other part of the third connection structures may be first connectors.

According to a second aspect, this application further provides a packaging structure. The packaging structure includes a die and the packaging substrate according to the first aspect. The die is located on a first surface of a body. The die is connected to a plurality of first connection structures at the first surface of the body.

Based on the foregoing structure, a part of the plurality of first connection structures are connected to second connection structures by using metal cabling, and the other part of the plurality of first connection structures are connected to third connection structures by using the metal cabling. Therefore, the second connection structures and the third connection structures may both serve as pins of the packaging structure. The second connection structures are located at a second surface of a body of the packaging substrate, and the third connection structures are located at a side surface of the body of the packaging substrate. In other words, a part of pins of the packaging structure are transferred to the side surface of the body of the packaging substrate, to reduce a quantity of pins at the second surface. The packaging substrate with a smaller area may be used to manufacture the packaging structure, to reduce a packaging size.

In one embodiment, the first surface of the body of the packaging substrate further includes the third connection structures. Therefore, a part of pins are transferred to the first surface. When a total quantity of pins is fixed, the quantity of pins distributed at the second surface are further reduced, to further reduce the packaging size.

In one embodiment, the packaging structure further includes a protection component. The protection component is located at the first surface of the body, and is connected to the first surface. The protection component and the first surface form accommodation space. The die is located in the accommodation space. The die is relatively fragile. To avoid damage to the die, on the first surface of the body, the protection component is used to cover the die, to isolate the die from the outside.

In the solution shown in this embodiment of this application, the third connection structures located at the first surface are also located in the accommodation space. A sidewall of the protection component further includes at least one of a second connector and a through hole.

In an example, the sidewall of the protection component includes the second connector. The second connector includes two interfaces. One of the two interfaces is located on an inner sidewall of the protection component, and the other one is located on an outer sidewall of the protection component. After the interface located on the inner sidewall of the protection component is connected to the third connection structure located at the first surface by using a leading wire, the third connection structure may be connected to a peripheral circuit by using the interface that is of the second connector and that is located on the outer sidewall of the protection component. The connector is conveniently plugged and unplugged. In cases such as maintenance, it is also convenient to implement a disconnection.

In another example, the sidewall of the protection component includes the through hole. When the packaging structure is connected to the peripheral circuit, the leading wire connected to the third connection structure located at the first surface may directly pass through the through hole. Then, the packaging structure is connected to the peripheral circuit by using the leading wire.

In still another example, the sidewall of the protection component includes both the second connector and the through hole. In this way, the packaging structure may be connected to the peripheral circuit by using the connector, and the packaging structure may be further connected to the peripheral circuit by using the leading wire through the through hole.

In one embodiment, the packaging structure further includes at least one of a leading wire and an optical fiber. As described above, one end of the leading wire is connected to the third connection structure at the first surface of the body, and the other end is connected to the second connector, or directly extends to the accommodation space through the through hole. If the leading wire is connected to the second connector, a connection may be established between the packaging structure and the peripheral circuit by using the second connector. If the leading wire directly extends to the accommodation space through the through hole, the leading wire may be directly connected to the peripheral circuit.

For the die to which an optical signal may be input or from which an optical signal may be output, one end of the optical fiber is connected to the die, and the other end is connected to the second connector, or directly extends to the accommodation space through the through hole. If the optical fiber is connected to the second connector, an optical signal may be input to or output from the packaging structure by using the second connector. If the optical fiber directly extends to the accommodation space through the through hole, the optical fiber may be directly connected to another device to which an optical signal can be input or from which an optical signal can be output, to implement optical communication.

In the solution shown in this embodiment of this application, the second connector may include an electrical connector and an optical connector. The second connector connected to the leading wire is the electrical connector, and the second connector connected to the optical fiber is the optical connector.

In one embodiment, the protection component includes a support frame and a cover. The cover is located on a side that is of the support frame and that is away from the packaging substrate, and is connected to the support frame. The other side of the support frame is connected to the first surface. The support frame supports the cover away from the first surface of the body, to form accommodation space between the cover and the first surface of the packaging substrate to accommodate the die.

In an example, the support frame and the cover are an integrated structure. The support frame and the cover form an upper cover. The upper cover is clamped to the packaging substrate to protect the die. The upper cover may be made of a material with relatively large rigidity, for example, metal.

In another example, the support frame and the cover are separated structures. The two may be connected in a manner such as bonding. For example, the support frame is a reinforcing ring, and the cover is a heat sink. The heat sink is directly bonded to the reinforcing ring. The heat sink is used to provide better heat dissipation for the die.

In one embodiment, an inner wall of the cover may be a convex surface. The convex surface keeps in contact with the die, so that heat generated by the die can be conducted to the cover.

In an example, a surface that is of the cover and that is close to the packaging substrate includes a boss. The boss is in contact with a surface that is of the die and that is away from the packaging substrate. The heat generated when the die works may be directly conducted to the cover by using the boss. This facilitates heat dissipation of the die. In addition, the boss is used to increase a distance between the cover and the first surface of the packaging substrate. In this way, the support frame may be disposed higher, so that the support frame can have more space to dispose the second connector and/or the through hole.

According to a third aspect, an embodiment of this application further provides an electronic device. The electronic device includes at least one packaging structure according to the second aspect.

According to a fourth aspect, this application provides a method for manufacturing a packaging structure. The manufacturing method includes:

providing a packaging substrate, where the packaging substrate is the packaging substrate according to the first aspect; and disposing a die on a first surface of a body of the packaging substrate, where the die is connected to a plurality of first connection structures at the first surface.

The die is disposed on the first surface of the body of the packaging substrate. A connection is established with the die by using the plurality of first connection structures at the first surface of the body. In this way, second connection structures at a second surface of the body of the packaging substrate and third connection structures at a side surface may serve as pins of a packaging structure. Therefore, a quantity of pins at the second surface is reduced, to reduce a packaging size.

In one embodiment, the protection component may be further disposed on the first surface of the body. The protection component is the protection component mentioned in the foregoing first aspect. The protection component and the first surface form accommodation space. The protection component covers the die, to isolate the die from the outside and avoid damage to the die.

In the solution shown in this embodiment of this application, before the protection component is disposed on the body, at least one of a second connector and a through hole may be formed on a sidewall of the protection component.

After the second connector is formed on the sidewall of the protection component, the connector is connected to the third connection structure located at the first surface by using a leading wire. Then, the third connection structure located at the first surface may be connected to a peripheral circuit by using the second connector. The connector is conveniently plugged and unplugged. In cases such as maintenance, it is also convenient to implement a disconnection.

After the through hole is formed on the sidewall of the protection component, when the packaging structure is connected to the peripheral circuit, the leading wire connected to the third connection structure located at the first surface may directly pass through the through hole. Then, the third connection structure is connected to the peripheral circuit by using the leading wire.

In one embodiment, after at least one of the second connector and the through hole is formed on the sidewall of the protection component, at least one of a leading wire and an optical fiber may be further disposed.

In an example, when the leading wire is disposed, one end of the leading wire is connected to the third connection structure located at the first surface; and the other end of the leading wire is connected to the second connector, or the other end of the leading wire passes through the through hole.

In an example, when the optical fiber is disposed, one end of the optical fiber is connected to the die; and the other end of the optical fiber is connected to the second connector, or the other end of the optical fiber passes through the through hole.

In one embodiment, a support frame and a cover are an integrated structure, and the support frame and the cover form an upper cover. Before the upper cover is disposed to the body, the leading wire or the optical fiber may be first disposed to the support frame, and then the upper cover is disposed on the first surface.

In one embodiment, when the upper cover is disposed, thermally conductive silicone may be further applied to an inner wall of the upper cover or a surface of the die, so that the inner wall of the upper cover is in contact with the surface of the die by using the thermally conductive silicone. In this way, heat emitted by the die can be better conducted to the upper cover for dissipation.

In one embodiment, a support frame and a cover are separated structures. The support frame is a reinforcing ring, and the cover is a heat sink. When the protection component is disposed, the reinforcing ring may be first disposed on the first surface, then the leading wire or the optical fiber may be disposed to the reinforcing ring, and finally the heat sink is bonded to the reinforcing ring.

In one embodiment, when the heat sink is disposed, thermally conductive silicone may be further applied to a surface that is of the heat sink and that is close to the packaging substrate or a surface of the die, so that the heat sink is in contact with the surface of the die by using the thermally conductive silicone. In this way, heat emitted by the die can be better conducted to the heat sink for dissipation.

DESCRIPTION OF ILLUSTRATIONS

Figure 1:
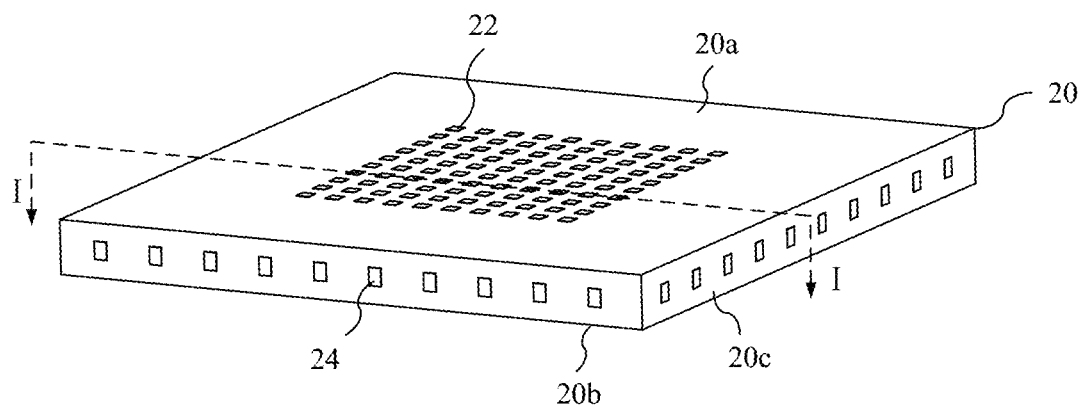
FIG. 1 is a schematic structural diagram of a packaging substrate according to an embodiment of this application.

100. Die 20. Body 20a. First surface 20b. Second surface 20c. Side surface
21. Metal cabling 22. First connection structure 23. Second connection structure 24. Third connection structure
200. Packaging substrate 201. First circuit structure layer 202. Core layer 203. Second circuit structure layer 204. Through hole 2011. Dielectric layer 2012. Pattern layer 20121. Metal pattern 300. Protection component 301. Support frame 302. Cover 3001. Second connector 3002. Through hole 3021. Boss 400. Leading wire 500. Optical fiber 7000. Printed circuit board 7001. Circuit
8000. Packaging structure A. Accommodation space

DESCRIPTION OF EMBODIMENTS

An embodiment of this application provides a packaging substrate. The packaging substrate may be a substrate that is in an electronic device and that is configured to package a die.

FIG. 1 is a schematic structural diagram of a packaging substrate according to an embodiment of this application. As shown in FIG. 1, the packaging substrate includes a body 20. The body 20 includes a first surface 20a, a second surface 20b, and a side surface 20c. The side surface 20c is connected to the first surface 20a and the second surface 20b.

The first surface 20a includes a plurality of first connection structures 22. The first connection structures 22 are configured to connect to a die. The second surface 20b includes second connection structures 23. The second connection structures 23 are configured to serve as pins. The side surface 20c includes third connection structures 24. The third connection structures 24 are also configured to serve as pins.

Figure 2:
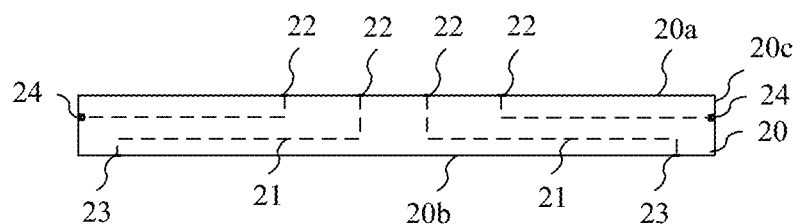
FIG. 2 is a sectional view of a packaging substrate according to an embodiment of this application.

FIG. 2 is a sectional view of a packaging substrate according to an embodiment of this application. A section shown in FIG. 2 is an I-I section in FIG. 1. As shown in FIG. 2, the body 20 includes metal cabling 21. A part of the plurality of first connection structures 22 are connected to the second connection structures 23 by using the metal cabling 21, and the other part of the plurality of first connection structures 22 are connected to the third connection structures 24 by using the metal cabling 21.

Because the second connection structures 23 and the third connection structures 24 of the packaging substrate may both serve as pins, when the same total quantity of pins need to be disposed, disposing the third connection structures 24 is equivalent to transferring a part of pins from the second surface 20b to the side surface 20c of the body 20, to reduce a quantity of pins at the second surface 20b. In this way, when packaging is performed on a die, the packaging substrate with a smaller area may be used, to reduce a packaging size.

In an example, the body 20 may be in a circular board shape. In other words, the first surface 20a and the second surface 20b of the body 20 are both circular, and the side surface 20c is a cylindrical surface.

In an example, as shown in FIG. 1, the body 20 may be in a rectangular board shape. In other words, the first surface 20a and the second surface 20b of the body 20 are both rectangular, and the body 20 includes a plurality of side surfaces 20c, where each side surface 20c is also rectangular.

A shape of the body 20 may be selected according to requirements of different packaging structures, for example, a polygonal board shape. In the embodiments of this application, the body 20 in the rectangular board shape is used as an example for description.

Figure 3:
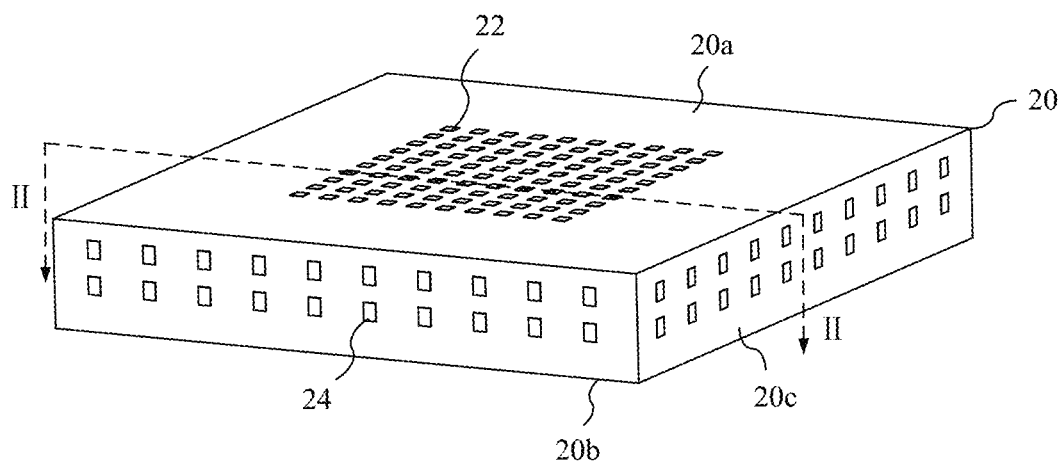
FIG. 3 is a schematic structural diagram of a packaging substrate according to an embodiment of this application.

FIG. 3 is a schematic structural diagram of a packaging substrate according to an embodiment of this application. As shown in FIG. 3, in the packaging substrate, the side surface 20c of the body 20 includes two rows of third connection structures 24, and the two rows of third connection structures 24 are distributed with a gap in a thickness direction of the body 20.

In comparison with FIG. 1, in the packaging substrate shown in FIG. 3, more third connection structures 24 may be distributed at the side surface 20c of the body 20, so that more pins can be transferred to the side surface 20c of the body 20. The third connection structures 24 are disposed at the surface of the body 20 of the packaging substrate. When a total quantity of required pins is fixed, more third connection structures 24 are disposed. More pins are transferred from the second surface 20b of the body 20 to the side surface 20c, to further reduce a packaging size.

In some examples, three or more rows of third connection structures 24 may be further distributed at the side surface 20c of the body 20, to transfer more pins from the second surface 20b of the body 20 to the side surface 20c.

In some examples, the same quantity of third connection structures 24 may be distributed at all side surfaces 20c of the body 20; or the same quantity of third connection structures 24 may be distributed at some side surfaces 20c, and different quantities of third connection structures 24 may be distributed at some side surfaces 20c.

For example, 20 third connection structures 24 may be distributed at each side surface 20c of the body 20. Alternatively, in four side surfaces 20c of the body 20, 20 third connection structures 24 are distributed at each of two side surfaces 20c, and 10 third connection structures 24 and 15 third connection structures 24 are respectively distributed at the other two side surfaces 20c.

In some examples, in a plurality of side surfaces 20c of the body 20, the third connection structures 24 may be distributed at only some side surfaces 20c.

For example, the body 20 includes four side surfaces 20c. The third connection structures 24 are distributed at only two side surfaces 20c.

Figure 4:
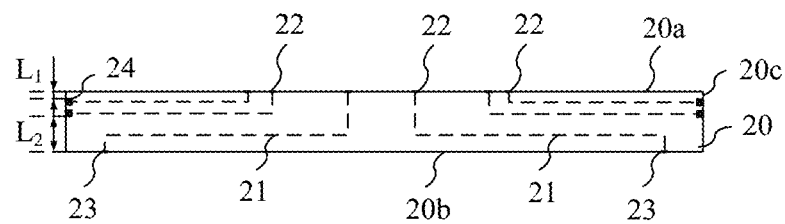
FIG. 4 is a sectional view of a packaging substrate according to an embodiment of this application.

FIG. 4 is a sectional view of a packaging substrate according to an embodiment of this application. A section shown in FIG. 4 is an II-II section in FIG. 3. As shown in FIG. 4, at the side surface 20c, a minimum distance $L_2$ between the third connection structure 24 and the second surface 20b is not less than a minimum distance $L_1$ between the third connection structure 24 and the first surface 20a.

The minimum distance $L_2$ between the third connection structure 24 and the second surface 20b is a vertical distance between the second surface 20b and the third connection structure 24 in a row of third connection structures 24 closest to the second surface 20b. The minimum distance $L_1$ between the third connection structure 24 and the first surface 20a is a minimum distance between the first surface 20a and the third connection structure 24 in a row of third connection structures 24 closest to the first surface 20a.

The minimum distance $L_2$ between the third connection structure 24 and the second surface 20b is not less than the minimum distance $L_1$ between the first surface 20a and the third connection structure 24. This is equivalent to that the third connection structure 24 is closer to the first surface 20a. The second connection structure 23 of the packaging substrate is configured to connect to a printed circuit board. If the third connection structure 24 is excessively close to the second surface 20b, after the packaging substrate is connected to the printed circuit board, the third connection structure 24 is very close to a surface of the printed circuit board. This does not facilitate a connection between the third connection structure 24 at the side surface 20c and a peripheral circuit. In addition, there is a risk that the third connection structure 24 is short-circuited to the printed circuit board. The third connection structure 24 located at the side surface 20c is closer to the first surface 20a, to facilitate the connection between the third connection structure 24 and the peripheral circuit and reduce the risk that the third connection structure 24 is short-circuited to the printed circuit board.

Figure 5:
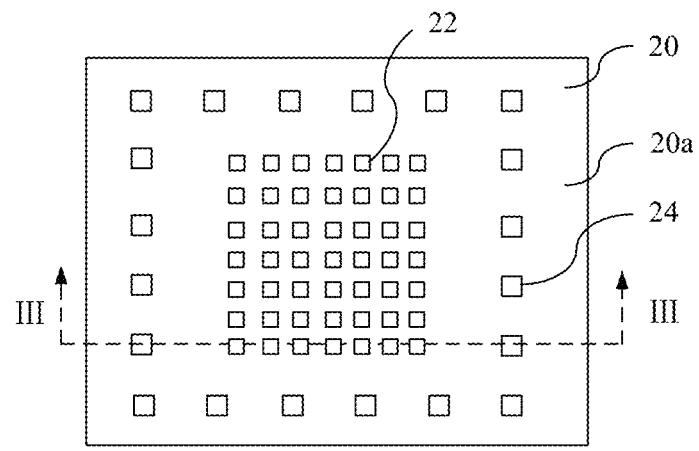
FIG. 5 is a top view of a packaging substrate according to an embodiment of this application.
Figure 6:
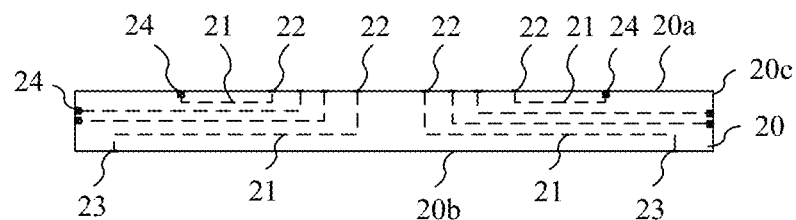
FIG. 6 is a sectional view of a packaging substrate according to an embodiment of this application.

FIG. 5 is a top view of a packaging substrate according to an embodiment of this application. As shown in FIG. 5, in the packaging substrate, the first surface 20a of the body 20 also includes the third connection structures 24. FIG. 6 is a sectional view of a packaging substrate according to an embodiment of this application. A section shown in FIG. 6 is an III-III section shown in FIG. 5. The third connection structures 24 located at the first surface 20a of the body 20 are also connected to the first connection structures 22 by using the metal cabling 21.

The first connection structures 22 usually do not occupy an entire region of the first surface 20a. Even the die is disposed on the first surface 20a of the body 20, the first surface 20a still includes some empty regions. The third connection structures 24 may be disposed on these empty regions, to fully use the surface of the body 20. A specific quantity of third connection structures 24 are disposed at the first surface 20a, to transfer a part of pins to the first surface 20a, thereby further fully use the surface of the body 20 to dispose pins. In this way, a quantity of pins disposed at the second surface 20b can be further reduced, to further reduce a packaging size.

As shown in FIG. 5, the first surface 20a includes a plurality of third connection structures 24. The plurality of third connection structures 24 located at the first surface 20a are distributed around the plurality of first connection structures 22.

The first connection structures 22 are generally distributed in a middle region of the first surface 20a of the body 20. A remaining surrounding region of the first surface 20a is in an idle state, and is not fully used. The plurality of third connection structures 24 are distributed in the surrounding region of the first surface 20a, so that the plurality of third connection structures 24 are distributed around the plurality of first connection structures 22. In this way, the first surface 20a of the body 20 is fully used. In addition, leading wires can be disposed from different directions to connect the peripheral circuit to the third connection structures 24 located at the first surface 20a.

In this embodiment of this application, the plurality of first connection structures 22 are divided into at least three parts. A part of the first connection structures 22 are connected to the second connection structures 23 by using the metal cabling 21, another part of the first connection structures 22 are connected by using the metal cabling 21 to the third connection structures 24 located at the side surface 20c of the body 20, and the remaining part of the first connection structures 22 are connected by using the metal cabling 21 to the third connection structures 24 located at the first surface 20a of the body 20. In this way, after the die is disposed on the first surface 20a of the body 20 and the die is connected to the first connection structures 22, pin fan-out may be implemented from the first surface 20a, the second surface 20b, and the side surface 20c of the body 20, to fully use surfaces of the body 20. In comparison with a case in which pin fan-out is implemented only from the second surface 20b, when the same total quantity of pins are disposed, a smaller packaging substrate can be used to implement chip packaging.

Figure 7:
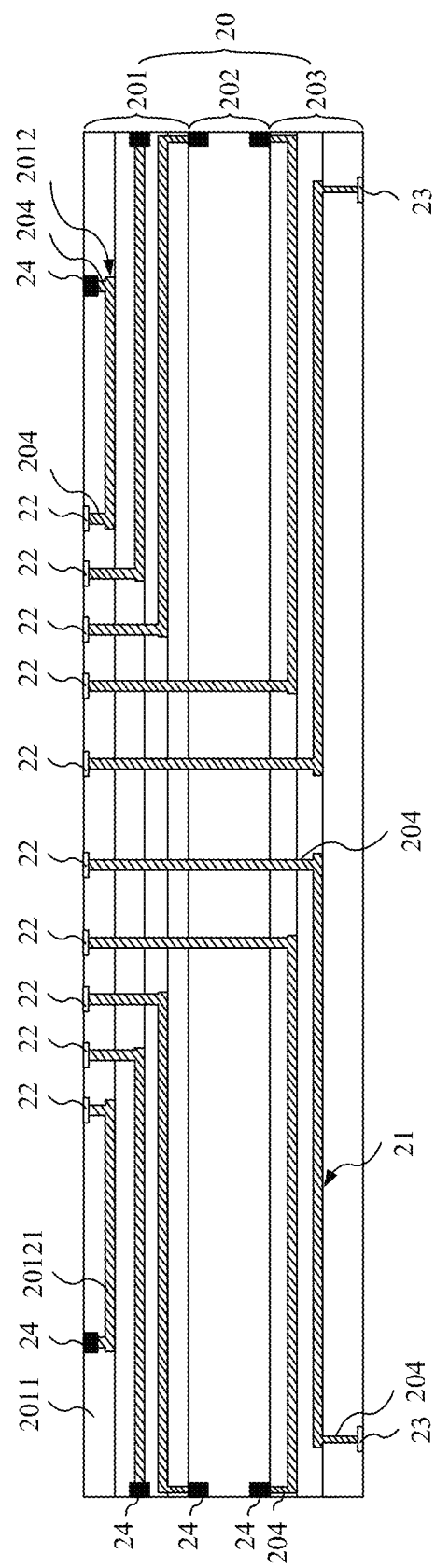
FIG. 7 is a sectional view of a packaging substrate according to an embodiment of this application.

FIG. 7 is a sectional view of a packaging substrate according to an embodiment of this application. As shown in FIG. 7, the body 20 may include a first circuit structure layer 201, a core layer (core) 202, and a second circuit structure layer 203. The core layer 202 is located between the first circuit structure layer 201 and the second circuit structure layer 203. The first connection structures 22 are located at a surface that is of the first circuit structure layer 201 and that is away from the core layer 202. The second connection structures 23 are located at a surface that is of the second circuit structure layer 203 and that is away from the core layer 202.

In some embodiments, the first circuit structure layer 201 and the second circuit structure layer 203 each may include dielectric layers 2011 and pattern layers 2012 that are alternately stacked. The dielectric layer 2011 has good insulating property. The pattern layer 2012 includes a metal pattern 20121, to provide a conduction path.

The body 20 further includes a through hole 204. The through hole 204 may be located in the first circuit structure layer 201, the second circuit structure layer 203, or the core layer 202.

The metal pattern 20121 may be connected by using the through hole 204 to one of the first connection structure 22, the second connection structure 23, and the third connection structure 24 located at the surfaces of the body 20. Metal patterns 20121 of different pattern layers 2012 may also be connected by using the through hole 204.

In an example, the metal pattern 20121 may be formed by using a pattern forming technology. Etching is performed on a metal layer, to form the metal pattern 20121. For example, the metal pattern 20121 may be made of metal copper or metal aluminium.

The core layer 202 has higher rigidity than the first circuit structure layer 201 and the second circuit structure layer 203, to serve as a framework implementing a supporting function.

In some embodiments, the metal cabling 21 may be located in the body 20. In some other embodiments, the metal cabling 21 may be alternatively located at the surfaces of the body 20.

For the metal cabling 21 located in the body 20, the metal cabling 21 may include the through hole 204 and the metal pattern 20121 located in the body 20. One end of the through hole 204 is connected to the metal cabling 21, and the other end of the through hole 204 is connected to one of the first connection structure 22, the second connection structure 23, and the third connection structure 24.

For example, as shown in FIG. 7, the metal cabling 21 connects the first connection structure 22 to the third connection structure 24 located at the first surface 20a. One through hole 204 is connected to the first connection structure 22, and another hole 204 is connected to the third connection structure 24.

In some embodiments, the metal cabling 21 may include a plurality of metal patterns 20121 located in the body 20. The plurality of metal patterns 20121 may be connected by using the through hole 204.

For the metal cabling 21 located at the surfaces of the body 20, the metal cabling 21 may include the metal pattern 20121 located at the surface of the first circuit structure layer 201.

Figure 8:
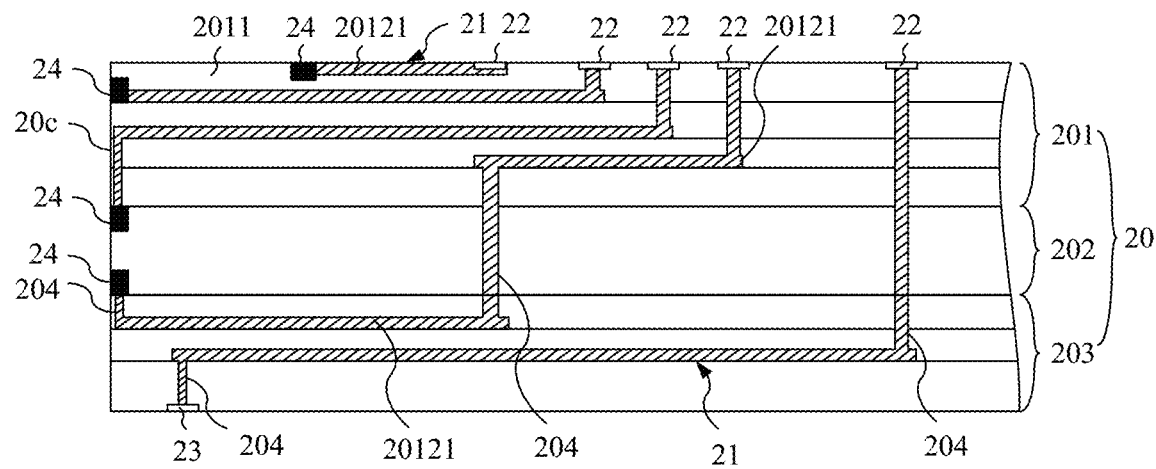
FIG. 8 is a partial sectional view of a packaging substrate according to an embodiment of this application.

For example, FIG. 8 is a partial sectional view of a packaging substrate according to an embodiment of this application. In FIG. 8, the metal cabling 21 connects the first connection structure 22 to the third connection structure 24 located at the first surface 20a. The metal cabling 21 includes the metal pattern 20121 located at the surface of the first circuit structure layer 201. The metal pattern 20121 is separately connected to the first connection structure 22 and the third connection structure 24.

In an example, the third connection structures 24 located at the side surface 20c of the body 20 may be distributed outside the second circuit structure layer 203. In other words, the third connection structures 24 may be distributed at the first circuit structure layer 201 or the core layer 202. A purpose is that the third connection structures 24 are away from the second surface 20b of the body 20, to facilitate the connection between the third connection structure 24 and the peripheral circuit and reduce the risk that the third connection structure 24 is short-circuited to the printed circuit board.

For example, as shown in FIG. 8, on the side surface 20c of the body 20, one row of third connection structures 24 may be distributed at the first circuit structure layer 201, one row or two rows of third connection structures 24 may be distributed at the core layer 202, and no third connection structure 24 is distributed at the second circuit structure layer 203. The third connection structures 24 distributed at the core layer 202 may be located at a surface at which the core layer 202 is in contact with the first circuit structure layer 201, or at a surface at which the core layer 202 is in contact with the second circuit structure layer 203, or between the two surfaces.

As described above, the third connection structures 24 located at the side surface 20c of the body 20 are distributed outside the second circuit structure layer 203 to increase a distance between the third connection structure 24 and the second surface 20b of the body 20. If a thickness of the second circuit structure layer 203 is large enough, the third connection structures 24 may also be distributed at the second circuit structure layer 203 when an enough distance is ensured between the third connection structure 24 and the second surface 20b of the body 20.

In an example, the first connection structure 22, the second connection structure 23, and the third connection structure 24 may be pads. When being welded to different structures, the pads may have different forms. For example, the first connection structure 22 is configured to connect to the die. A solder ball is usually distributed at a bottom surface of the die. To facilitate welding to the solder ball, the first connection structure 22 may be a metal plate. The second connection structure 23 serves as a pin, and is welded to a printed circuit board. The second connection structure 23 may be a solder ball. The third connection structure 24 is configured to connect to a leading wire, and may be welded to the leading wire. In this way, the packaging substrate is connected to the peripheral circuit by using the leading wire. The third connection structure 24 may be a metal plate.

Figure 9:
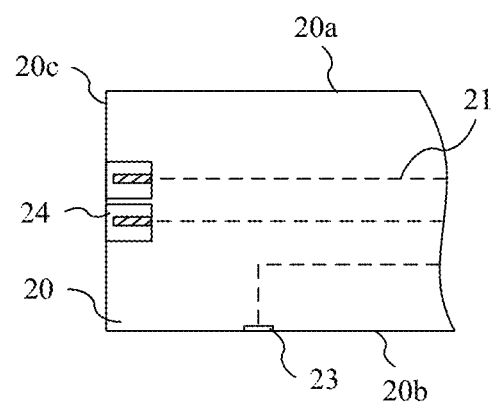
FIG. 9 is a partial schematic structural diagram of a packaging substrate according to an embodiment of this application.

In an example, FIG. 9 is a partial schematic structural diagram of a packaging substrate according to an embodiment of this application. As shown in FIG. 9, the third connection structure 24 may also be a first connector. The connector is used as the third connection structure 24. In this case, when the packaging substrate is connected to the peripheral circuit, plugging and unplugging can be directly performed with no need for welding. This operation is convenient.

Figure 10:
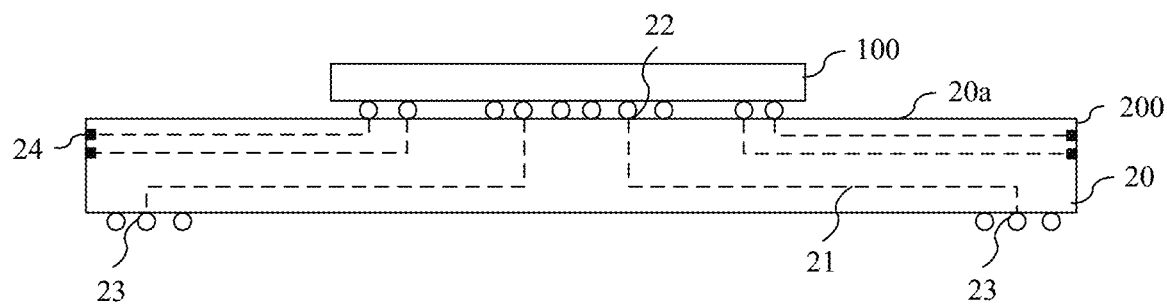
FIG. 10 is a schematic diagram of a packaging structure according to an embodiment of this application.

FIG. 10 is a schematic diagram of a packaging structure according to an embodiment of this application. As shown in FIG. 10, the packaging structure includes the die 100 and the packaging substrate 200. The packaging substrate 200 may be any packaging substrate shown in FIG. 1 to FIG. 9. In this embodiment of this application, the packaging substrate shown in FIG. 4 is used as an example. The die 100 is located on the first surface 20a of the body 20 of the packaging substrate 200, and is connected to the plurality of first connection structures 22 located at the first surface 20a of the body 20.

As shown in FIG. 10, the die 100 may be welded to the first connection structures 22 located at the surface of the body 20 of the packaging substrate 200 by using solder balls.

Based on the foregoing structure, because a part of the plurality of first connection structures 22 of the packaging substrate 200 are connected to the second connection structures 23, and the other part of the plurality of first connection structures 22 are connected to the third connection structures 24, both the second connection structures 23 and the third connection structures 24 may serve as pins of the packaging structure. However, the second connection structures 23 and the third connection structures 24 are distributed at different surfaces of the body 20, so that the surfaces of the body 20 are fully used for disposing the pins. In addition, a quantity of pins at the second surface 20b is reduced. A packaging structure may be manufactured by using the packaging substrate 200 with a smaller area, thereby reducing a packaging size.

Figure 11:
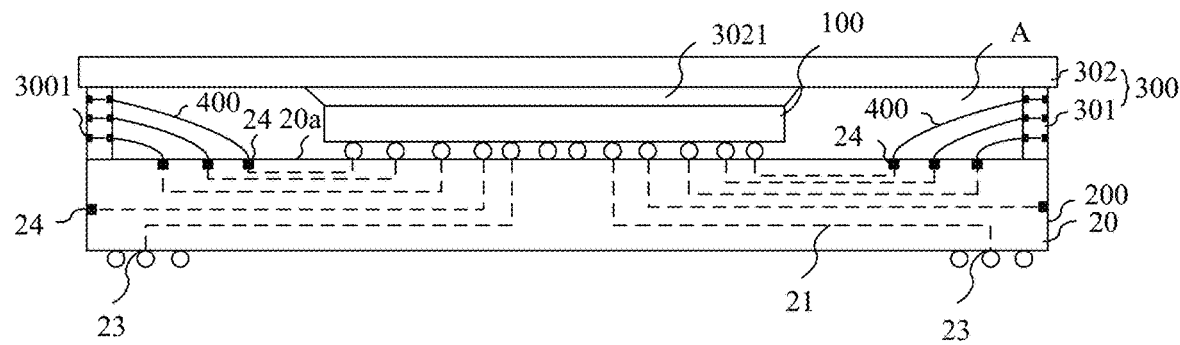
FIG. 11 is a schematic diagram of a packaging structure according to an embodiment of this application.

FIG. 11 is a schematic diagram of a packaging structure according to an embodiment of this application. As shown in FIG. 11, the packaging structure further includes a protection component 300. The protection component 300 is located on the first surface 20a of the body 20, and is connected to the first surface 20a. The protection component 300 and the first surface 20a form accommodation space A. The die 100 is located in the accommodation space A. The protection component 300 covers the die 100, to separate the die 100 from the outside and avoid damage to the die 100.

In some embodiments, the protection component 300 may include a support frame 301 and a cover 302. The cover 302 is located on a side that is of the support frame 301 and that is away from the packaging substrate 200, and is connected to the support frame 301. The other side of the support frame 301 is connected to the first surface 20a of the body 20.

The packaging structure usually includes two types: lidless (Lidless) and lidded (Lidded).

For a lidless packaging structure, in an example, as shown in FIG. 11, the support frame 301 may be a reinforcing ring (ring), and the cover 302 may be a heat sink. The reinforcing ring is disposed around the die 100. The heat sink is supported away from a surface of the packaging substrate 200. Therefore, the heat sink and the surface of the packaging substrate 200 form the accommodation space A. The heat sink may be in contact with a surface that is of the die 100 and that is away from the packaging substrate 200, so that heat generated when the die 100 works can be conducted to the heat sink, and be rapidly dissipated by using the heat sink. Thermally conductive silicone may be further disposed between the heat sink and the die 100, so that heat exchange can be more quickly performed between the die 100 and the heat sink.

Figure 12:
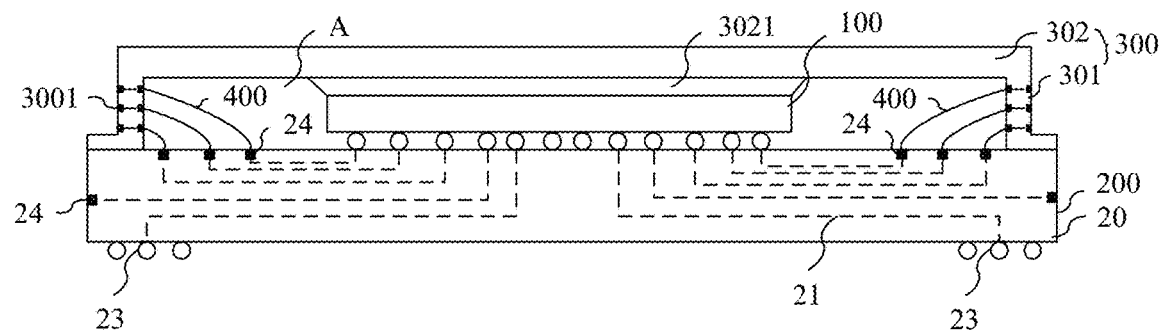
FIG. 12 is a schematic diagram of a packaging structure according to an embodiment of this application.

For a lidded packaging structure, in an example, FIG. 12 is a schematic diagram of a packaging structure according to an embodiment of this application. As shown in FIG. 12, the support frame 301 and the cover 302 may be an integrated structure, and the protection component 300 is an upper cover (lid). The upper cover is clamped to the packaging substrate 200 to protect the die 100. An inner wall of the upper cover, that is, a surface that is of the cover 302 and that is close to the packaging substrate 200, may also be in contact with the die 100. In this way, heat generated when the die 100 works can be conducted to the upper cover, and be dissipated by using the surface of the upper cover, to accelerate heat dissipation. Thermally conductive silicone may also be disposed between the upper cover and the die 100, so that heat exchange can be more quickly performed between the die 100 and the upper cover.

As shown in FIG. 11 or FIG. 12, the first surface 20a of the body 20 of the packaging substrate 200 also includes the third connection structures 24. In the solution shown in this embodiment of this application, a specific quantity of third connection structures 24 are disposed at the first surface 20a, so that a part of pins are transferred to the first surface 20a. When a total quantity of pins is fixed, the quantity of pins distributed at the second surface 20b are further reduced, to further reduce the packaging size.

In this embodiment of this application, the third connection structures 24 at the first surface 20a of the body 20 are located in the accommodation space A. Therefore, the protection component 300 may be used to protect the third connection structures 24 of the first surface 20a.

In an example, in order that the part of the third connection structures 24 can be connected to the peripheral circuit, a sidewall of the protection component 300 may include at least one of a second connector 3001 and a through hole 3002.

For example, in FIG. 11 and FIG. 12, the sidewall of the protection component 300 includes the second connector 3001. The second connector 3001 includes two interfaces. One of the two interfaces is located on an inner sidewall of the protection component 300, and the other one is located on an outer sidewall of the protection component 300. A connection may be established between the interface that is of the second connector 3001 and that is located on the inner sidewall of the protection component 300, and the third connection structure 24 located at the first surface 20a of the body 20, so that the third connection structure 24 can be connected to the peripheral circuit by using the interface that is of the second connector 3001 and that is located on the outer sidewall of the protection component 300.

Figure 13:
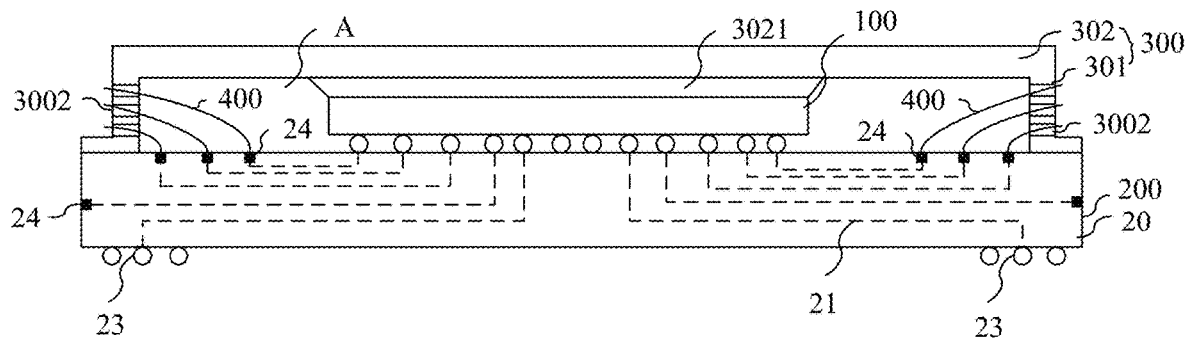
FIG. 13 is a schematic diagram of a packaging structure according to an embodiment of this application.

FIG. 13 is a schematic diagram of a packaging structure according to an embodiment of this application. As shown in FIG. 13, the sidewall of the protection component 300 includes the through hole 3002. When the third connection structure 24 is connected to the peripheral circuit, the leading wire may be disposed in the through hole 3002. One end of the leading wire is connected to the third connection structure 24 located at the first surface 20a, and the other end of the leading wire is connected to the peripheral circuit.

In some embodiments, the sidewall of the protection component 300 may include both the second connector 3001 and the through hole 3002. A connection is established between the peripheral circuit and a part of third connection structures 24 at the first surface 20a by using the second connector 3001, and a connection may be established between the peripheral circuit and the other part of third connection structures 24 by using the leading wire in the through hole 3002.

In one embodiment, a surface that is of the cover 302 and that is close to the packaging substrate 200 includes a boss 3021. For example, as shown in FIG. 13, the boss 3021 is in contact with a surface that is of the die 100 and that is away from the packaging substrate 200.

The boss 3021 can be used to increase a distance between the cover 302 and the packaging substrate 200. In this case, the support frame 301 with a larger height can be disposed, so that an area of the sidewall of the protection component 300 is larger. In this way, more second connectors 3001 or more through holes 3002 may be disposed on the sidewall of the protection component 300. For example, as shown in FIG. 12, three rows of second connectors 3001 are distributed on the sidewall of the protection component 300. As shown in FIG. 13, three rows of through holes 3002 are distributed on the sidewall of the protection component 300.

In one embodiment, the packaging structure may further include at least one of a leading wire 400 and an optical fiber 500.

For example, as shown in FIG. 12 or FIG. 13, the packaging structure further includes the leading wire 400. One end of the leading wire 400 is connected to the third connection structure 24 at the first surface 20a of the body 20; and the other end of the leading wire 400 is connected to the second connector 3001, or the other end of the leading wire 400 passes through the through hole 3002 and is located outside the accommodation space A.

The leading wire 400 may be a metal wire, for example, a gold wire or a copper wire.

A connection manner of the leading wire 400 and the third connection structure 24 may depend on a structure form of the third connection structure 24. For example, if the third connection structure 24 is a pad, the leading wire 400 and the third connection structure 24 may be connected in a welding manner. If the third connection structure 24 is a connector, an end of the leading wire 400 may have a joint matching the third connection structure 24. The joint is plugged in and connected to the third connection structure 24.

Figure 14:
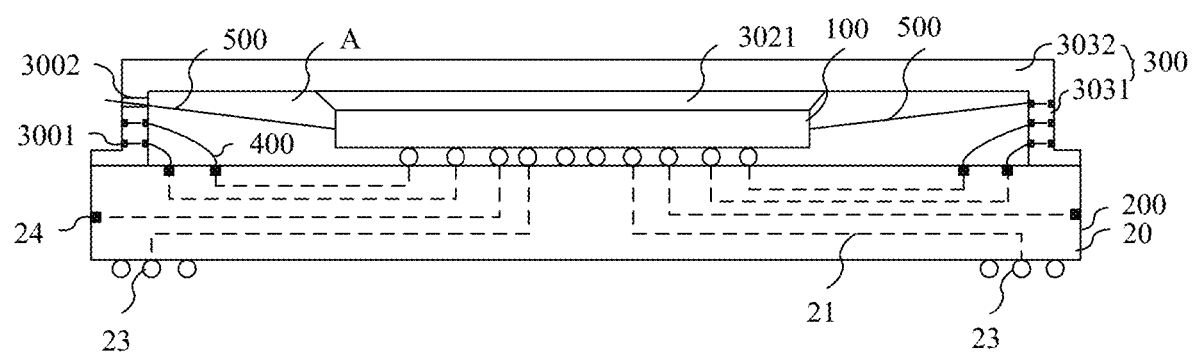
FIG. 14 is a schematic diagram of a packaging structure according to an embodiment of this application.

FIG. 14 is a schematic diagram of a packaging structure according to an embodiment of this application. As shown in FIG. 14, the packaging structure further includes an optical fiber 500. One end of the optical fiber 500 is connected to the die 100; and the other end of the optical fiber 500 is connected to the second connector 3001, or the other end of the optical fiber 500 passes through the through hole 3002 and is located outside the accommodation space A. An optical signal may be input to or output from some dies 100. One end of the optical fiber 500 is connected to the die 100, and the other end is connected to the second connector 3001, so that the second connector 3001 can be used to establish a connection to another device. The optical fiber 500 directly passes through the through hole 3002, so that the optical fiber 500 can be directly connected to another device, to implement optical communication.

Figure 15:
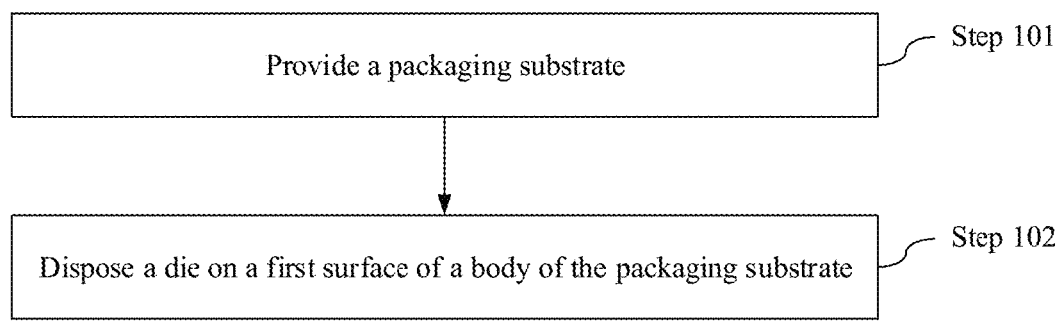
FIG. 15 is a flowchart of a method for manufacturing a packaging structure according to an embodiment of this application.

FIG. 15 is a flowchart of a method for manufacturing a packaging structure according to an embodiment of this application. As shown in FIG. 15, the manufacturing method includes the following operations:

Operation 101: Provide a packaging substrate 200.

The packaging substrate 200 is any packaging substrate shown in FIG. 1 to FIG. 9.

Operation 102: Dispose a die 100 on a first surface 20a of a body 20 of the packaging substrate 200. The die 100 is connected to a plurality of first connection structures 22 located at the first surface 20a of the body 20 of the packaging substrate 200.

An embodiment of this application further provides an electronic device. The electronic device may be a mobile terminal, for example, a mobile phone or a tablet computer; or may be a computer device; or may be another electronic device having a packaging structure. The electronic device may include at least one packaging structure shown in FIG. 10 to FIG. 14.

When the packaging structure including a protection component is manufactured, after operation 102, the protection component 300 may be further disposed on the first surface 20a of the body 20 of the packaging substrate 200.

The protection component 300 includes a support frame 301 and a cover 302. The support frame 301 and the cover 302 may be separated structures, or may be an integrated structure. Different protection components 300 may be disposed in different manners.

For example, for the packaging structure shown in FIG. 11, the support frame 301 and the cover 302 are separated structures, the support frame 301 is a reinforcing ring, and the cover 302 is a heat sink. When the protection component is disposed, the reinforcing ring may be first disposed on the first surface 20a, so that the die 100 is located in the reinforcing ring. Then, the heat sink is disposed on the reinforcing ring.

In one embodiment, the heat sink may be bonded to the reinforcing ring. The heat sink may be in contact with a surface that is of the die 100 and that is away from the packaging substrate 200, so that heat generated when the die 100 works can be conducted to the heat sink.

In one embodiment, before the heat sink is disposed, thermally conductive silicone may be further applied to a surface of the heat sink or a surface that is of the die 100 and that is away from the packaging substrate 200, so that the die 100 is in contact with the heat sink by using the thermally conductive silicone, to improve heat exchange efficiency between the die 100 and the heat sink.

For example, for the packaging structure shown in FIG. 12, the support frame 301 and the cover 302 are an integrated structure, and the support frame 301 and the cover 302 form an upper cover. After the die 100 is disposed, the upper cover may be fastened to the packaging substrate 200, so that the upper cover covers the die 100.

In one embodiment, before the upper cover is disposed, thermally conductive silicone may be further applied to an inner surface of the upper cover or a surface that is of the die 100 and that is away from the packaging substrate 200, so that the die 100 is in contact with the upper cover by using the thermally conductive silicone, to improve heat exchange efficiency between the die 100 and the upper cover.

To dispose at least one of the leading wire 400 and the optical fiber 500 in the packaging structure, a second connector 3001 and/or a through hole 3002 may further be formed on a sidewall of the protection component 300 before the protection component 300 is disposed. Then, when the protection component 300 is disposed on the first surface 20a, at least one of the leading wire 400 and the optical fiber 500 is disposed.

For example, when the second connector 3001 is formed, a hole may be disposed on a sidewall of the support frame 301, and the second connector 3001 may be fastened to the hole. When the through hole 3002 is formed, the through hole 3002 may be directly disposed on the sidewall of the support frame 301.

In an example, for the packaging structure shown in FIG. 11, the support frame 301 and the cover 302 are separated structures. The support frame 301 may first be fastened to the first surface 20a. Then, one end of the leading wire 400 is connected to the third connection structure 24 located at the first surface 20a; and then the other end of the leading wire 400 is connected to the second connector 3001 on the sidewall of the support frame 301, or the other end of the leading wire 400 passes through the through hole 3002 on the sidewall of the support frame 301. Finally, the cover 302 is connected to the support frame 301.

For the packaging structure shown in FIG. 12, the support frame 301 and the cover 302 are an integrated structure. One end of the leading wire 400 is connected to the third connection structure 24 located at the first surface 20a; and then the other end of the leading wire 400 is connected to the second connector 3001 on the sidewall of the support frame 301, or the other end of the leading wire 400 passes through the through hole 3002 on the sidewall of the support frame 301. Finally, the protection component 300 is fully fastened to the support frame 301.

A connection manner of the leading wire 400 and the third connection structure 24 may depend on a specific structure form of the third connection structure 24. For example, if the third connection structure 24 is a pad, the leading wire 400 may be welded to the third connection structure 24; or if the third connection structure 24 is a connector, the leading wire 400 may be plugged in and connected to the third connection structure 24.

A difference between a manner of disposing the optical fiber 500 and a manner of disposing the leading wire 400 is that one end of the optical fiber 500 is connected to the die 100 instead of being connected to the third connection structure 24 located at the first surface 20a. If the packaging structure includes both the leading wire 400 and the optical fiber 500, the leading wire 400 and the optical fiber 500 may be disposed at the same time.

Figure 16:
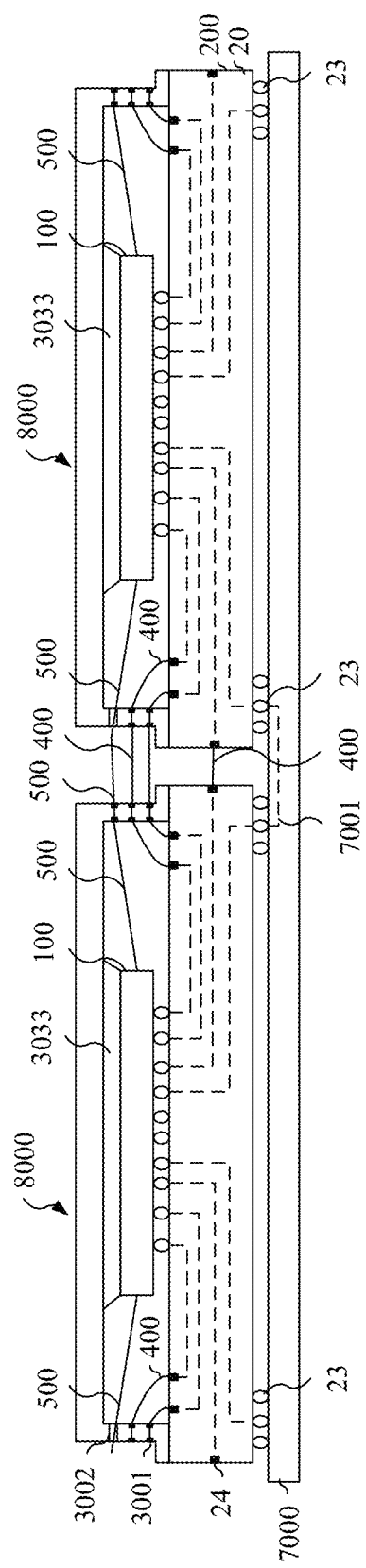
FIG. 16 is a partial schematic structural diagram of an electronic device according to this application.

FIG. 16 is a partial schematic structural diagram of an electronic device according to this application. As shown in FIG. 16, the electronic device includes a printed circuit board 7000 and at least two packaging structures 8000.

The packaging structure 8000 may be welded to the printed circuit board 7000. Different packaging structures 8000 may be connected by using a circuit 7001 in the printed circuit board 7000, or may be connected by using the leading wire 400 or the optical fiber 500.

For example, as shown in FIG. 16, second connection structures 23 of different packaging structures 8000 may be connected by using the circuit 7001 in the printed circuit board 7000. Third connection structures 24 of different packaging structures 8000 may be connected by using the leading wire 400. Dies 100 of different packaging structures 8000 may be connected by using the optical fiber 500.

In the embodiments of this application, the second connection structures and the third connection structures of the packaging substrate may both serve as pins. When the same total quantity of pins need to be disposed, some pins are transferred to the side surface of the body, to reduce a quantity of pins at the second surface. In this way, a packaging size is reduced. In addition, when connections are established between different packaging structures 8000, a connection may be established by using the circuit in the printed circuit board 7000, and a connection may be established through connecting the third connection structures 24 of different packaging structures 8000 by using the leading wire 400. Therefore, a requirement for the printed circuit board 7000 is reduced, to simplify the circuit 7001 in the printed circuit board 7000.

The foregoing descriptions are merely specific embodiments of this application, but are not intended to limit this application. Any modification, equivalent replacement, or improvement made without departing from the spirit and principle of this application should fall within the protection scope of this application.

What is claimed is:

1. A packaging substrate, comprising
 a body comprising
  a metal cabling;
  a first surface comprising a plurality of first connection structures configured to connect to a die;
  a second surface comprising second connection structures configured to serve as pins; and
  a side surface comprising third connection structures configured to serve as pins, wherein the side surface is connected to the first surface and the second surface, wherein the side surface comprises at least two rows of the third connection structures distributed with a gap in a thickness direction of the body, and wherein
  a part of the plurality of first connection structures are connected to the second connection structures by using the metal cabling, and another part of the plurality of first connection structures are connected to the third connection structures by using the metal cabling.

2. The packaging substrate according to claim 1, wherein a minimum distance between the second surface and the third connection structure located at the side surface is not less than a minimum distance between the first surface and the third connection structure located at the side surface.

3. The packaging substrate according to claim 1, wherein the first surface further comprises the third connection structures.

4. The packaging substrate according to claim 3, wherein the first surface comprises a plurality of the third connection structures, and wherein the plurality of the third connection structures located at the first surface are distributed around the plurality of the first connection structures.

5. The packaging substrate according to claim 1, wherein the third connection structure is a pad or a first connector.

6. A packaging structure, comprising
 a packaging substrate comprising
  a body comprising
   a metal cabling;
   a first surface comprising a plurality of first connection structures configured to connect to a die;
   a second surface comprising second connection structures configured to serve as pins; and
   a side surface comprising third connection structures configured to serve as pins, wherein the side surface is connected to the first surface and the second surface, wherein the side surface comprises at least two rows of the third connection structures distributed with a gap in a thickness direction of the body, and wherein a part of the plurality of first connection structures are connected to the second connection structures by using the metal cabling, and another part of the plurality of first connection structures are connected to the third connection structures by using the metal cabling; and
 a die, wherein the die is located at the first surface, and is connected to the plurality of first connection structures.

7. The packaging structure according to claim 6, wherein the first surface further comprises the third connection structures.

8. The packaging structure according to claim 7, wherein the packaging structure further comprises a protection component located at the first surface and connected to the first surface;
 wherein the protection component and the first surface form accommodation space (A), and wherein the die and the third connection structures at the first surface are both located in the accommodation space (A); and
 wherein a sidewall of the protection component comprises at least one of a second connector or a through hole, wherein the second connector comprises two interfaces, one of the two interfaces is located on an inner sidewall of the protection component, and another one is located on an outer sidewall of the protection component.

9. The packaging structure according to claim 8, wherein the packaging structure further comprises at least one of
a leading wire or an optical fiber;
wherein one end of the leading wire is connected to the third connection structure at the first surface; and wherein another end of the leading wire is connected to the second connector, or another end of the leading wire passes through the through hole and is located outside the accommodation space (A); and
wherein one end of the optical fiber is connected to the die; and wherein another end of the optical fiber is connected to the second connector, or another end of the optical fiber passes through the through hole and is located outside the accommodation space (A).

10. The packaging structure according to claim 8, wherein the protection component comprises a support frame and
a cover, the cover is located on a side of the support frame away from the packaging substrate, and is connected to the support frame, and wherein another side of the support frame is connected to the first surface; and
wherein a surface of the cover close to the packaging substrate comprises a boss, and wherein the boss is in contact with a surface of the die away from the packaging substrate.

11. The packaging structure according to claim 10, wherein the cover is a heat sink.

12. An electronic device, comprising at least one packaging structure comprising
a die; and
a packaging substrate comprising
a body comprising
a metal cabling;
a first surface comprising a plurality of first connection structures configured to connect to a die;
a second surface comprising second connection structures configured to serve as pins; and
a side surface comprising third connection structures configured to serve as pins, and wherein the side surface is connected to the first surface and the second surface, wherein the side surface comprises at least two rows of the third connection structures distributed with a gap in a thickness direction of the body; and
wherein a part of the plurality of first connection structures are connected to the second connection structures by using the metal cabling, and another part of the plurality of first connection structures are connected to the third connection structures by using the metal cabling.

13. A method for manufacturing a packaging structure, comprising:
providing a packaging substrate, wherein the packaging substrate comprising
a body comprising a metal cabling; a first surface comprising a plurality of first connection structures configured to connect to a die; a second surface comprising second connection structures configured to serve as pins; and a side surface comprising third connection structures configured to serve as pins, wherein the side surface is connected to the first surface and the second surface, wherein the side surface comprises at least two rows of the third connection structures distributed with a gap in a thickness direction of the body, and wherein a part of the plurality of first connection structures are connected to the second connection structures by using the metal cabling, and another part of the plurality of first connection structures are connected to the third connection structures by using the metal cabling; and
disposing a die at the first surface of the body of the packaging substrate, wherein the die is connected to the plurality of first connection structures at the first surface.

14. The method according to claim 13, wherein the first surface further comprises the third connection structures.

15. The method according to claim 14, further comprising:
disposing a protection component on the first surface, wherein the protection component and the first surface form accommodation space (A), wherein the die and the third connection structures at the first surface are both located in the accommodation space (A), wherein a sidewall of the protection component comprises at least one of a second connector or a through hole, wherein the second connector comprises two interfaces, one of the two interfaces is located on an inner sidewall of the protection component, and wherein another one is located on an outer sidewall of the protection component.

16. The method according to claim 15, wherein the disposing a protection component on the first surface comprises:
disposing at least one of a leading wire or an optical fiber, wherein one end of the leading wire is connected to the third connection structure located at the first surface, and wherein another end of the leading wire is connected to the second connector (3001), or another end of the leading wire passes through the through hole; and wherein one end of the optical fiber is connected to the die, and another end of the optical fiber is connected to the second connector, or another end of the optical fiber passes through the through hole; and
fastening the protection component to the packaging substrate, so that the die and the third connection structures at the first surface are both located in the accommodation space (A).

17. The method according to claim 15, wherein
the protection component comprises a support frame and
a cover, wherein the cover is located on a side of the support frame away from the packaging substrate and connected to the support frame, and another side of the support frame is connected to the first surface; and
a surface of the cover close to the packaging substrate comprises a boss in contact with a surface of the die away from the packaging substrate.

18. The method according to claim 17, wherein the cover is a heat sink.

* * * * *